(12) United States Patent
Shah et al.

(10) Patent No.: US 10,699,866 B2
(45) Date of Patent: Jun. 30, 2020

(54) MODULAR FUSE HOLDER AND ARRANGEMENT AND CONNECTION THEREOF

(71) Applicant: Eaton Intelligent Power Limited, Dublin (IE)

(72) Inventors: Rushabh Dhanesh Shah, Surat (IN); Patrick Thomas McKinney, Portland, OR (US); Aswini N, Perambur (IN); Brandon William Fisher, Portland, OR (US)

(73) Assignee: Eaton Intelligent Power Limited, Dublin 4 (IE)

( * ) Notice: Subject to any disclaimer, the term of this patent is extended or adjusted under 35 U.S.C. 154(b) by 0 days.

(21) Appl. No.: 16/516,983

(22) Filed: Jul. 19, 2019

(65) Prior Publication Data
US 2019/0341215 A1    Nov. 7, 2019

Related U.S. Application Data

(62) Division of application No. 15/602,802, filed on May 23, 2017, now Pat. No. 10,395,878.

(Continued)

(51) Int. Cl.
*H01H 85/20* (2006.01)
*H01H 85/041* (2006.01)
*H05K 1/18* (2006.01)

(52) U.S. Cl.
CPC .... *H01H 85/2045* (2013.01); *H01H 85/0411* (2013.01); *H01H 85/203* (2013.01);
(Continued)

(58) Field of Classification Search
CPC .......... H01H 85/2045; H01H 85/0411; H01H 85/203; H01H 85/2035; H01H 2085/2085;
(Continued)

(56) References Cited

U.S. PATENT DOCUMENTS 3,993,395 A   11/1976 Taylor
4,722,701 A   2/1988 Bradt
(Continued)

FOREIGN PATENT DOCUMENTS

EP   1164660 A1   12/2001
EP   1235246 A2   8/2002
EP   2549516 A1   1/2013

*Primary Examiner* — Jayprakash N Gandhi
*Assistant Examiner* — Stephen S Sul
(74) *Attorney, Agent, or Firm* — Ziolkowski Patent Solutions Group, SC

(57) ABSTRACT

A fuse holder includes a holder base comprising a plurality of protrusions each having a mounting hole formed therein to provide for mounting of the holder base to an external component and one or more mating protrusions and one or more mating slots formed on each of opposing side surfaces. The fuse holder also includes an input stud coupled to or formed on the holder base and a cover configured to attach to the holder base to at least partially enclose one or more fuses positionable on the fuse holder. The one or more mating protrusions and the one or more mating slots formed on each of the opposing side surfaces of the holder base comprise dovetailed protrusions and slots of a matching profile capable of receiving such a dovetailed protrusion, so as to enable a side-by-side stacking and interlocking of fuse holders with such mating protrusions and mating slots.

18 Claims, 6 Drawing Sheets

Related U.S. Application Data

(60) Provisional application No. 62/340,603, filed on May 24, 2016.

(52) U.S. Cl.
CPC ........... H05K 1/18 (2013.01); *H01H 85/2035* (2013.01); *H01H 2085/209* (2013.01); *H01H 2085/2085* (2013.01); *H05K 2201/10181* (2013.01)

(58) Field of Classification Search
CPC ............... H01H 2085/209; H05K 1/18; H05K 2201/10181
USPC .......................................... 337/187, 191, 198
See application file for complete search history.

(56) References Cited

U.S. PATENT DOCUMENTS

| | | | |
|---|---|---|---|
| 4,767,339 A | 8/1988 | Comerci | |
| 5,023,752 A * | 6/1991 | Detter | B60R 16/0238 361/646 |
| 5,785,532 A * | 7/1998 | Maue | B60R 16/0238 439/34 |
| 6,226,174 B1 | 5/2001 | Pratt | |
| 6,773,307 B2 | 8/2004 | Beer | |
| 6,878,004 B2 | 4/2005 | Oh | |
| 6,891,463 B2 * | 5/2005 | Nagaoka | H01H 85/2035 337/187 |
| 6,902,434 B2 | 7/2005 | Stack | |
| 6,932,650 B1 | 8/2005 | Freitag | |
| 7,321,286 B2 * | 1/2008 | Nojima | H01H 85/205 337/186 |
| 8,053,669 B1 * | 11/2011 | Sodini | B60R 16/0238 174/59 |
| 8,587,931 B2 * | 11/2013 | Shiraiwa | H01R 9/2466 361/624 |
| 2001/0040050 A1 * | 11/2001 | Sumida | H01R 9/2458 174/261 |
| 2003/0134528 A1 * | 7/2003 | Tanaka | B60R 16/0238 439/76.2 |
| 2004/0043646 A1 * | 3/2004 | Takeuchi | H01R 9/223 439/76.2 |
| 2007/0064450 A1 | 3/2007 | Chiba et al. | |
| 2007/0270045 A1 * | 11/2007 | Korczynski | B60R 16/0238 439/723 |
| 2009/0269951 A1 * | 10/2009 | Scheele | H01R 9/2491 439/76.2 |
| 2010/0203746 A1 * | 8/2010 | Kita | H01H 85/2035 439/76.1 |
| 2011/0084549 A1 * | 4/2011 | Scheele | B60R 16/0239 307/9.1 |
| 2011/0148564 A1 | 6/2011 | Staylor | |
| 2012/0019344 A1 | 1/2012 | Darr | |
| 2012/0064771 A1 | 3/2012 | Urrea et al. | |
| 2013/0023156 A1 | 1/2013 | von zur Muehlen | |
| 2013/0033115 A1 | 2/2013 | Cutler et al. | |
| 2013/0044447 A1 * | 2/2013 | Shiozaki | H05K 1/0203 361/752 |
| 2014/0160697 A1 * | 6/2014 | Stern | H05K 5/006 361/752 |
| 2015/0016028 A1 * | 1/2015 | Darr | H05K 5/0047 361/626 |
| 2015/0165992 A1 * | 6/2015 | Scheele | B60R 16/0239 307/9.1 |
| 2015/0303446 A1 * | 10/2015 | Jung | H01M 2/024 429/7 |
| 2017/0018389 A1 | 1/2017 | Glad | |
| 2017/0040777 A1 * | 2/2017 | Von zur Muehlen | H01R 13/684 |

* cited by examiner

MODULAR FUSE HOLDER AND ARRANGEMENT AND CONNECTION THEREOF

CROSS REFERENCE TO RELATED APPLICATION

The present invention is a divisional of and claims priority to U.S. Non-Provisional patent application Ser. No. 15/602,802 filed May 23, 2017, which claims priority to U.S. Provisional Patent Application Ser. No. 62/340,603 filed May 24, 2016, the disclosures of which are incorporated herein by reference in their entireties.

BACKGROUND OF THE INVENTION

Embodiments of the invention relate generally to fuse holders and, more particularly, to a fuse holder having a construction that provides for modularity and arrangement with other like fuse holders in a flexible manner. A module of fuse holders formed of fuse holders having such a construction also includes a means for providing electrical inputs and outputs to each of the fuse holders.

The electrical systems of marine, construction, agriculture, heavy trucking, and other specialty vehicles that use direct current (DC) typically include fuses to protect the electrical system. The types of fuses used in the electrical system of such vehicles/machines is dependent upon the specific application, voltage, and current demands of the electrical system—with it being recognized that the fuses may be in the form of blade type fuses (e.g., ATM-mini fuses, ATC-Blade fuses and Maxi Fuses), bolt in type fuses such as AMG and AMI fuses, and/or marine rated battery fuses (MRBF fuses). The fuses are typically housed within a fuse holder that holds and protects the fuses, as well as allows for connection of the fuses with other components of the electrical system.

As indicated above, the types of fuses used in an electrical system is dependent upon the specific application, voltage, and current demands of the electrical systems, and it is recognized that each of the above mentioned automotive fuses have different physical dimensions or "footprints." In connection with this, the footprint and mounting requirement of fuse holder that houses the particular fuses will also vary depending on the type of fuses being housed. Accordingly, a specific arrangement of features is typically required for mounting each type of fuse holder within the vehicle/machine, such that a customer thus is not provided any flexibility in configuring or arranging the fuse holders as per different applications. It is further recognized that each fuse holder uses wires as the major sources of electrical input and output to the fuses therein such that, as the number of fuse holders included in an electrical system increases, the more cumbersome it is to manage the wiring to all of the fuse holders.

With particular regard to the blade type fuses previously mentioned (e.g., ATM-mini fuses, ATC-Blade fuses and Maxi Fuses), it is recognized that such fuses are widely used in many heavy automobiles for under-hood applications due to the fact that they are small in size and provide wide ampere range, such as from 1 A to 80 A. There are various fuse holders available for housing these blade type of fuses and, as also previously mentioned, each fuse holder typically has a different footprint and different requirements for mounting. Based on each of these fuse holders having a different footprint and different requirements for mounting, little to no flexibility for arranging fuses is provided as per customer applications.

Therefore, it is desirable to provide a fuse holder that provides flexibility with regard to being mounted within its respective vehicle and with regard to configuring or arranging the fuse holder with other fuse holders in an electrical system. It is further desirable for a module comprised of a number of fuse holders to provide a means for providing electrical inputs and outputs to each of the fuse holders in a manner that minimizes wire management issues typically associated with such modules.

BRIEF DESCRIPTION OF THE INVENTION

In accordance with one aspect of the present invention, a fuse holder includes a holder base comprising a plurality of protrusions each having a mounting hole formed therein to provide for mounting of the holder base to an external component and one or more mating protrusions and one or more mating slots formed on each of opposing side surfaces. The fuse holder also includes an input stud coupled to or formed on the holder base and a cover configured to attach to the holder base to at least partially enclose one or more fuses positionable on the fuse holder. The one or more mating protrusions and the one or more mating slots formed on each of the opposing side surfaces of the holder base comprise dovetailed protrusions and slots of a matching profile capable of receiving such a dovetailed protrusion, so as to enable a side-by-side stacking and interlocking of fuse holders with such mating protrusions and mating slots.

In accordance with another aspect of the present invention, a fuse assembly includes a fuse holder comprising a holder base having a main body, an electrically conductive insert molded in the main body, and a receptacle secured onto or formed integrally with the main body, the receptacle partially covering the electrically conductive insert and extending upwardly from the main body. The fuse holder also includes an input stud coupled to or formed on the holder base and electrically coupled to the electrically conductive insert. The fuse assembly further includes a printed circuit board (PCB) fuse assembly comprising a PCB, fuse terminal blocks mounted to the PCB, fuse terminals positioned within the fuse terminal blocks and electrically connected to the PCB, and blade-type fuses inserted in the fuse terminals and electrically connected to the PCB through the fuse terminals, wherein the PCB fuse assembly is secured onto the receptacle to mount the PCB fuse assembly on the holder base.

In accordance with yet another aspect of the present invention, a fuse holder for holding one or more marine rated battery fuses (MRBF fuses) therein is provided, the fuse holder including a holder base comprising an electrically conductive buss bar molded therein and a pair of connection studs coupled to or formed on the holder base, with the pair of connection studs constructed to provide for positioning of the one or more MRBF fuses thereon. The fuse holder also includes a cover configured to attach to the holder base to cover the one or more MRBF fuses and the pair of connection studs. The electrically conductive buss bar of the holder base transfers power from an input wire or buss bar to the one or more MRBF fuses, with the electrically conductive buss bar being electrically isolated from the pair of connection studs, such that the pair of connection studs are on a load side of the one or more MRBF fuses.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Embodiments of the invention are directed to a fuse holder having a construction that provides for modularity and arrangement with other like fuse holders in a flexible manner. A blade type fuse holder may further be provided that enables the housing of any of numerous variations of blade type fuses therein in a common holder construction.

Embodiments of the invention are described below as being directed to fuse holders configured to house blade type fuses (e.g., ATM-mini fuses, ATC-blade fuses and Maxi fuses), bolt-in type fuses such as AMG and AMI fuses, and/or marine rated battery fuses (MRBF fuses). However, it is envisioned that other types of fuses may also be housed in fuse holders having a construction and modularity as described herebelow, and thus the exemplary fuses and associated fuse holders described herein are understood to not limit the scope of the invention. Such fuses are envisioned as being incorporated in the electrical systems of marine, construction, agriculture, heavy trucking, and other specialty vehicles—but the usage of such fuses and accompanying fuse holders are not limited to such with respect to the scope of the present invention.

Referring now to FIGS. 1-4, modular fuse holders are shown according to various embodiments of the invention—with each of the fuse holders being designed to accommodate fuses of differing types, sizes and ratings. As described in greater detail below, each of the fuse holders includes a common feature of two mounting holes for bolting the fuse holder on the chassis of the vehicle in which the fuses are to be incorporated. Additionally, each fuse holder has mating features formed thereon that enable the fuse holder to be interfit with other fuse holders to form a modular array of fuse holders that may be arranged in a flexible fashion (per customer specifications/requirements) for mounting on the vehicle chassis.

Figure 1:
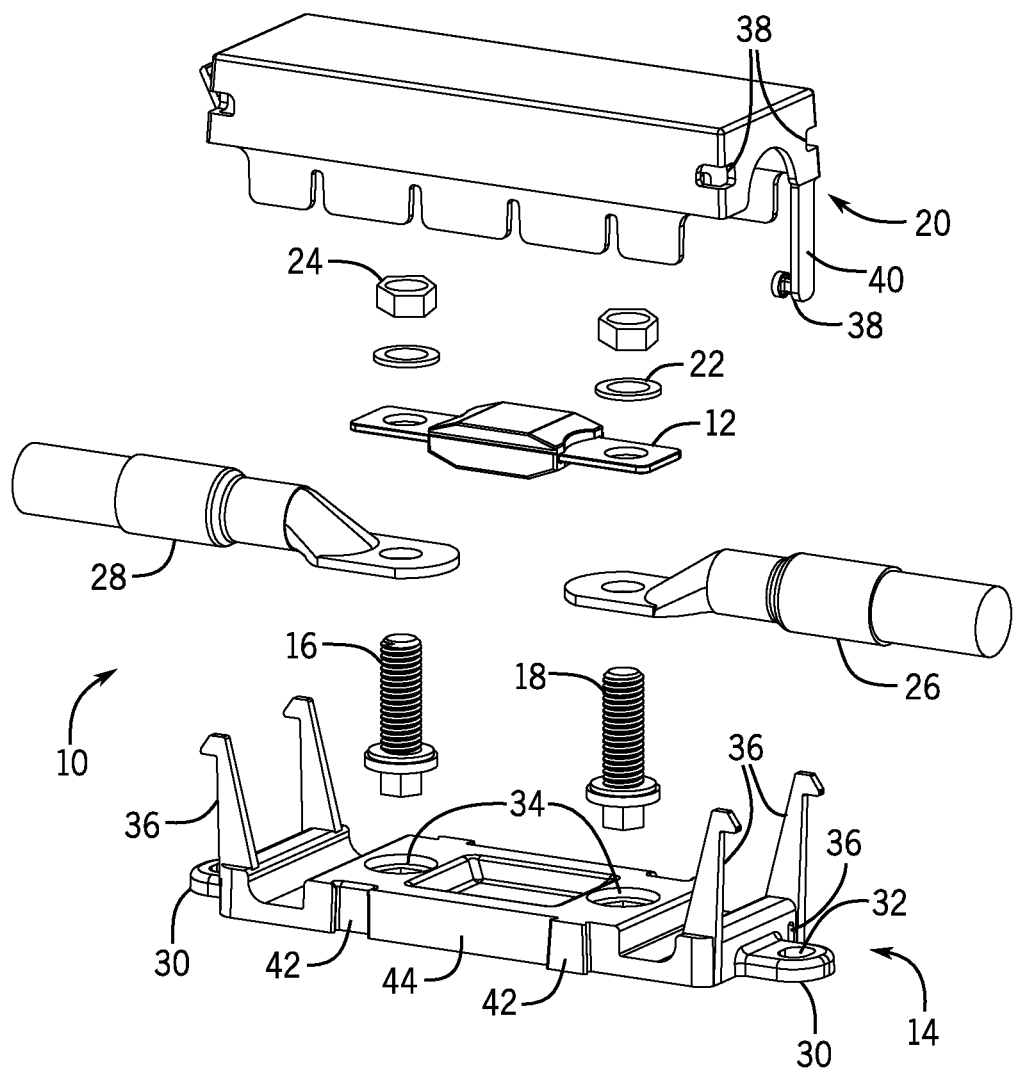
FIG. 1 is an exploded perspective view of a fuse holder according to an embodiment of the invention.

Referring first to FIG. 1, a fuse holder 10 is provided for housing a bolt-in type AMG fuse 12 therein. The fuse holder 10 generally includes a holder base 14, input and output studs 16, 18, a cover 20, hex washers 22, and lock nuts 24—with this collection of components providing for the securing of and electrical connectivity to an AMG fuse 12 housed therein. More specifically, the AMG fuse 12 is positioned inside the fuse holder 10 by guiding the fuse onto the input and output studs 16, 18 via openings on either side of the fuse, with the AMG fuse 12 being slid into a position such that it rests on the holder base 14. An output wire 26 (e.g., 2/0 gauge cable) is bolted to the AMG fuse 12 over the output stud 18 using a hex washer 22 and locknut 24 so as to electrically couple the fuse to an output load/device (not shown). In an exemplary embodiment, a buss bar (not shown) may be bolted to the AMG fuse 12 over the input stud 16 using a hex washer 22 and a locknut 24—as will be explained in greater detail later on, but it is recognized that an input wire 28 (e.g., 2/0 gauge cable) could instead be bolted to the AMG fuse 12 over the input stud 16 using a hex washer 22 and locknut 24. The cover 20 may then be secured on the holder base 14 to provide protection to the fuse holder 10.

With particular regard to the holder base 14, the holder base 14 is constructed to include protrusions 30 formed on opposing ends thereof—with each protrusion 30 including a mounting hole 32 formed therein, such that two mounting holes 32 are provided on the holder base 14. The two mounting holes 32 are formed to receive suitable fasteners therein that secure the fuse holder 10 to a vehicle chassis or other component to which the fuse holder 10 is to be mounted. The holder base 14 also includes a pair of receptacles 34 therein to/in which the input and output studs 16, 18 may be insert molded—with the input and output studs 16, 18 extending upwardly from the holder base 14 when secured thereto. A plurality of latching features 36 extend upwardly on the holder base 14 that interact with notches 38 formed on opposing ends of the cover 20, and a latching feature 36 is also formed on one end of the holder base 14 that extends outwardly therefrom to interact with a notch 38 formed in a downward extending arm 40 of the cover 20, with the latching features 36 and corresponding notches 38 thus securing the cover 20 to the holder base 14.

In order to provide for modularity of the fuse holder 10 and the arrangement thereof adjacent to other fuse holders of like construction, the holder base 14 includes a plurality of mating features on each of opposing sides thereof. The mating features include one or more mating protrusions 42 and mating slots 44 formed on each of the opposing sides of the holder base 14 that are configured to mate with identical mating protrusions and slots formed on other fuse holders, as will be explained in greater detail hereafter. In an exemplary embodiment, the mating protrusions 42 of the holder base 14 are formed to have a dovetail construction (i.e., a fan-shaped tenon) and the mating slots 44 are formed to have a corresponding fan-shaped opening or profile (i.e., a mortise) of similar size and shape as the dovetailed protrusions 42. The mating protrusions 42 and mating slots 44 formed on each of opposing sides of the holder base 14 therefore are constructed to provide an interlocking fit with like mating protrusions and mating slots of adjacent fuse holders.

Figure 2:
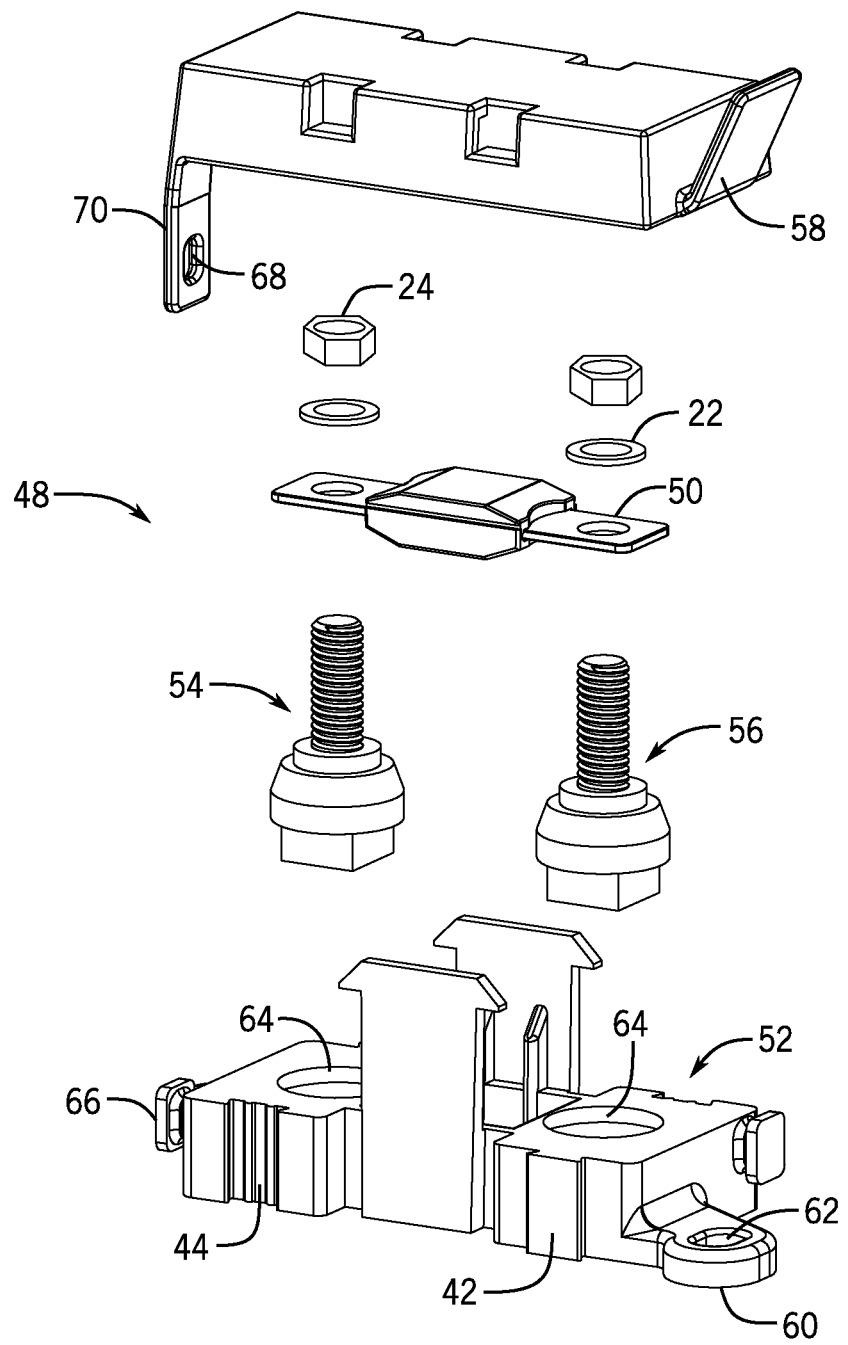
FIG. 2 is an exploded perspective view of a fuse holder according to an embodiment of the invention.

Referring now to FIG. 2, a fuse holder 48 is provided for housing bolt-in type AMI fuse 50 therein. Similar to the fuse holder 10 of FIG. 1, the fuse holder 48 generally includes a holder base 52, input and output studs 54, 56, a cover 58, hex washers 22, and lock nuts 24—with this collection of components providing for the securing of and electrical connectivity to an AMI fuse 50 housed therein. More specifically, the AMI fuse 50 is positioned inside the fuse holder 48 by guiding the fuse onto the input and output studs 54, 56 via openings on either side of the fuse, with the AMI fuse 50 being slid into a position such that it rests on the holder base 52. An output wire (not shown), such as a 2/0 gauge cable, is bolted to the AMG fuse 50 over the output stud 56 using a hex washer 22 and locknut 24 so as to electrically couple the fuse to an output load/device (not shown), and the cover 58 may be secured on the holder base 52 to provide protection to the fuse holder 48.

With particular regard to the holder base 52, the holder base 52 is constructed to include protrusions 60 formed on opposing ends thereof—with each protrusion 60 including a mounting hole 62 formed therein, such that two mounting holes 62 are provided on the holder base 52. The two mounting holes 62 are formed to receive suitable fasteners therein that secure the fuse holder 48 to a vehicle chassis or other component to which the fuse holder 48 is to be mounted. The holder base 52 also includes a pair of receptacles 64 therein to/in which the input and output studs 54, 56 may be insert molded—with the input and output studs 54, 56 extending upwardly from the holder base 52 when secured thereto. A latching feature 66 is formed on one end of the holder base 52 that extends outwardly therefrom—with the latching feature 66 interacting with a notch 68 formed in a downward extending arm 70 of the cover 58 in order to secure the cover 58 to the holder base 52.

Similar to holder base 14 of fuse holder 10, the holder base 52 of fuse holder 48 includes a plurality of mating features on each of opposing sides thereof—with the mating features being in the form of one or more mating protrusions 42 and mating slots 44 formed on each of the opposing sides of the holder base 52. In an exemplary embodiment, the mating protrusions 42 of the holder base 52 are formed to have a dovetail construction and the mating slots 44 are formed to have a corresponding fan-shaped opening or profile of similar size and shape as the dovetailed protrusion 42. The mating protrusions 42 and mating slots 44 formed on each of opposing sides of the holder base 52 therefore are constructed to provide an interlocking fit with like mating protrusions 42 and mating slots 44 of adjacent fuse holders. For example, the mating protrusions 42 and mating slots 44 of holder base 52 of fuse holder 48 can interlock with the mating protrusions 42 and mating slots 44 of holder base 14 of fuse holder 10 in order to provide for an interlocked side-by-side arrangement of the two fuse holders.

Figure 3:
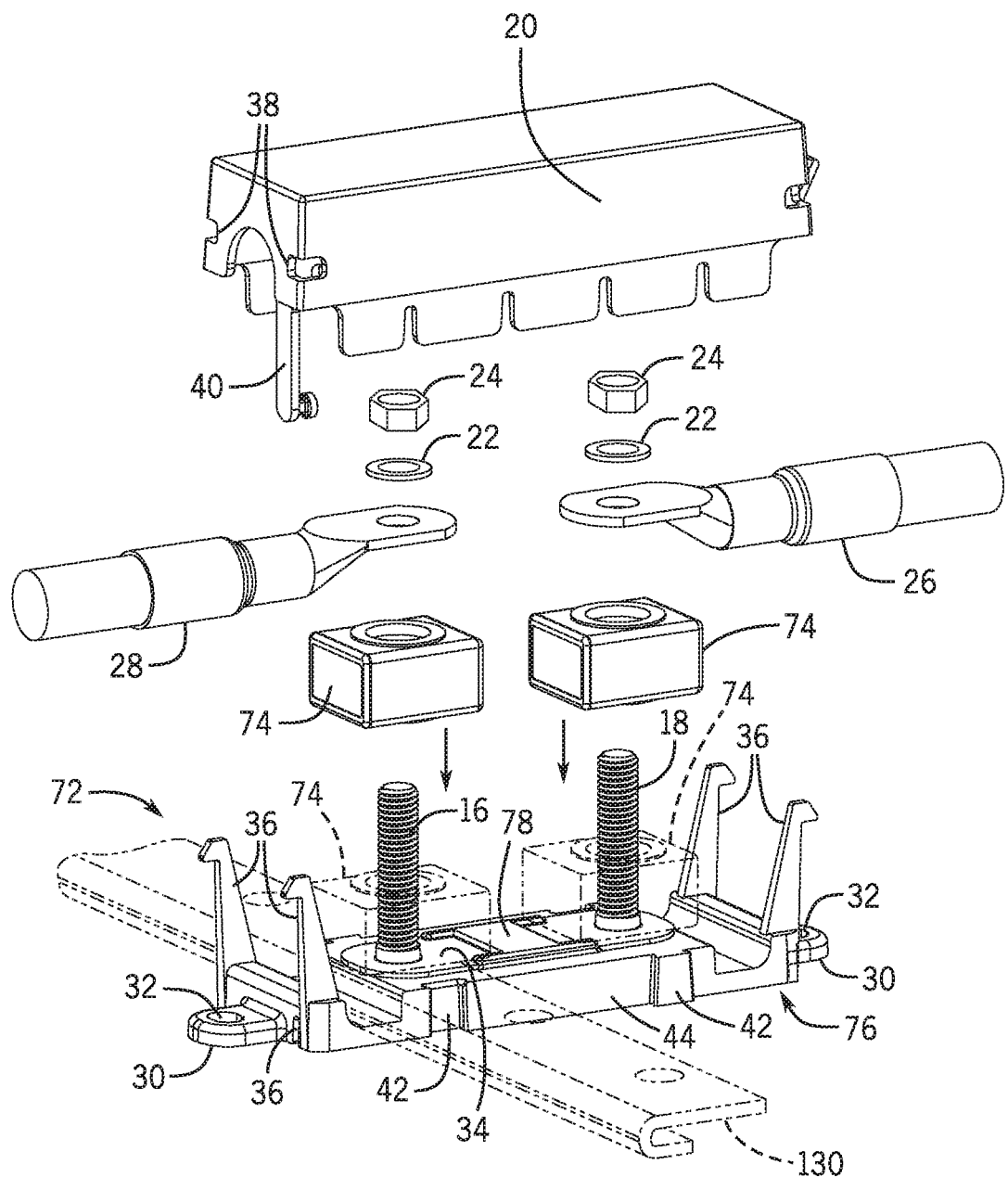
FIG. 3 is an exploded perspective view of a fuse holder according to an embodiment of the invention.

Referring now to FIG. 3, a fuse holder 72 is provided for housing one or more MRBF fuses 74 therein. The fuse holder 72 generally includes a holder base 76, a CF buss bar 78, studs 16, 18, a cover 20, hex washers 22, and lock nuts 24—with this collection of components providing for the securing of and electrical connectivity to one or more MRBF fuses 74 housed therein. While FIG. 4 illustrates that two MRBF fuses 74 are housed by fuse holder 72, it is recognized that, in another embodiment, only a single MRBF fuse 74 would be housed by fuse holder 72—as determined based on a particular application of the fuse holder 72 and MRBF fuse(s) 74.

As shown in FIG. 3, the one or more MRBF fuses 74 are positioned inside the fuse holder 72 by guiding the fuses onto the studs 16, 18 (i.e., one MRBF fuse 74 on each stud) via an opening in each of the fuses, with the MRBF fuses 74 being slid into a position such that they rest on the holder base 76. One MRBF fuse 74 is guided using the stud 16 and placed on a main input buss bar (not shown)—as will be explained in greater detail later on—and the second MRBF fuse 74 is guided using the stud 18 and placed on the CF buss bar 78. The holder base 76 provides a fully insulating substrate for the fuse holder, with input power being provided to the MRBF fuses 74 via an input wire or common buss bar (not shown) that can be electrically coupled to the CF buss bar 78, such as by being positioned onto stud 16 and put into contact with CF buss bar 78. The CF buss bar 78 is electrically isolated from the studs 16, 18, with the studs being on a load side of the MRBF fuses 74. Wires 26, 28 (e.g., 2/0 gauge cable) are bolted to the one or more MRBF fuses 74 over the studs 16, 18 using a hex washer 22 and locknut 24 so as to electrically couple the fuses to an output load/device (not shown). The cover 20 may then be secured on the holder base 76 to provide protection to the fuse holder 72, with the cover 20 being configured to cover the one or more MRBF fuses 74 as well as the studs 16, 18 to provide environmental protection thereto.

With particular regard to the holder base 76, the holder base construction is identical to that of the holder base 14 included in the fuse holder 10 of FIG. 1 with regard to the protrusions 30, mounting holes 32, receptacles 34, latching features 36, mating protrusions 42 and mating slots 44 formed therein/thereon—and thus these features are identified with like numbers to those feature in FIG. 1 and are not again described in detail. However, the holder base 76 of fuse holder 72 additionally includes the CF buss bar 78 therein—which is over molded inside the holder base 76. The CF buss bar 78 provides an electrical connection between the MRBF fuses 74 and therefore allows for power to be provided to each of the MRBF fuses 74 and outputs from each MRBF fuse 74 to be provided to output wire 26.

Figure 4:
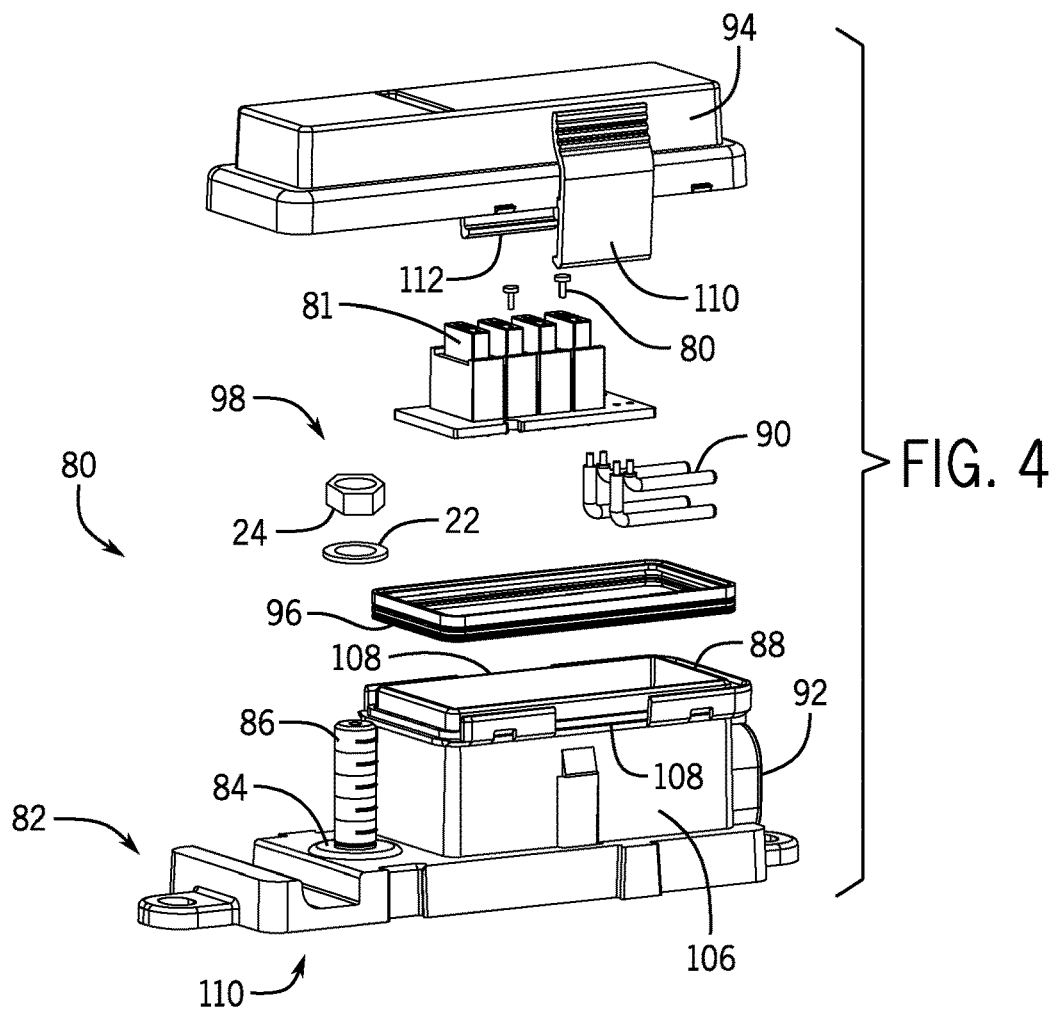
FIG. 4 is an exploded perspective view of a fuse holder according to an embodiment of the invention.

Referring now to FIG. 4, a fuse holder 80 is provided for housing blade-type fuses therein, such as ATM-mini fuses 81, for example. The fuse holder 80 generally includes a holder base 82 with an over molded copper buss bar 84 and input stud 86, input and output connecting pins 88, 90 (provided as part of the holder base), a female connector 92, a cover 94, a seal 96, a hex washer 22, a lock nut 24, and screws 98—with this collection of components providing for the securing of and electrical connectivity to the ATM-mini fuses 81 housed therein. More specifically, the copper bar 84 and input stud 86 are over molded inside the holder base 82—with the input connecting pins 88 being mechanically and electrically coupled to the copper bar 84 (which may be formed/bent at 90°) on the holder base 82 and the output connecting pins 90 being mechanically and electrically coupled to the female connector 92. The input and output connecting pins 88, 90 provide for an electrical connection to a printed circuit board (PCB) fuse assembly 98 in which the ATM-mini fuses 81 are included. The female connector 92 is electrically coupled to the PCB fuse assembly 98 through the output connecting pins 90, with the female connector 92 configured to receive the male part of an output wire (not shown) to electrically couple the fuses to an output load/device (not shown). A power input (not shown)—in the form of a wire (e.g., 2/0 gauge cable) or input bus—is bolted to the input stud 86 using a hex washer 22 and locknut 24, with the copper bar 84 and input connecting pins 88 then electrically coupling the power input to the PCB fuse assembly 98, such that power is provided thereto. The cover 94 may then be secured on the holder base 82 to provide protection to the fuse holder 80.

Figure 5:
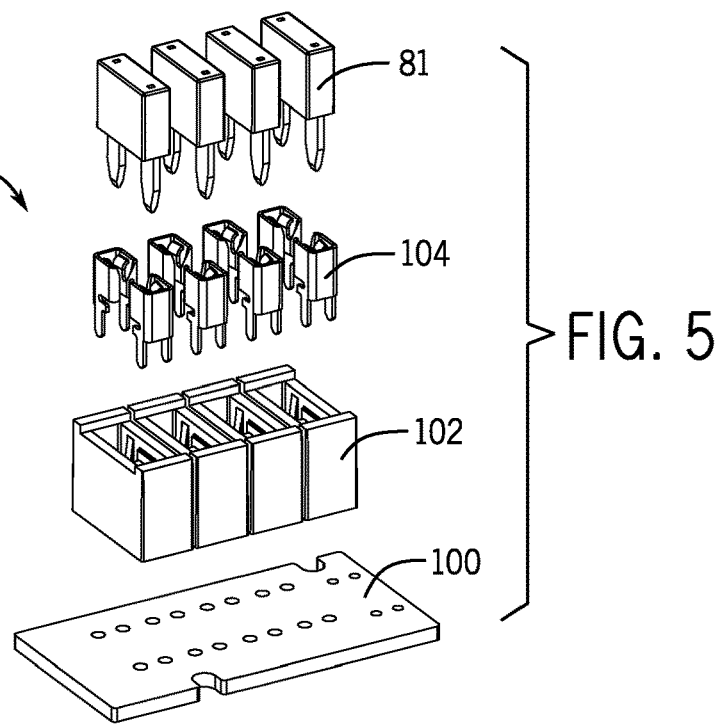
FIGS. 5-7 are perspective views of various printed circuit board (PCB) fuse assemblies that may be housed in the fuse holder of FIG. 4 according to embodiments of the invention.

The PCB fuse assembly 98 is shown in greater detail in FIG. 5—with it being seen therein that the PCB fuse assembly 98 includes a PCB 100, ATC-mini fuses 82, fuse terminal blocks 102, and fuse terminals 104. In the PCB fuse assembly 98, the fuse terminal blocks 102 are secured to the PCB 100 in an arrangement and quantity required to house the desired number of ATM-mini fuses 81 therein. The fuse terminals 104 are positioned within the fuse terminal blocks 102 and soldered to the PCB 100 (to copper trace paths therein) to provide an electrical connection thereto, with the fuse terminals 104 receiving ATM-mini fuses 81 that are inserted therein. The PCB fuse assembly 98 may then be placed onto the holder base 82 in a manner such that the PCB 100 is electrically connected to the input and output connecting pins 88, 90 of the fuse holder 80.

In operation, an input is provided to the fuse holder 80 through a single input wire (or buss bar) bolted to the input stud 86. Current passes through the copper bar that 84 is insert molded inside the holder base 82, and the input connecting pins 88 carry this current to the PCB 100. Copper trace paths (not shown) inside the PCB 100 carry this current to the fuses 82 and the fuses transmit this current through the output connecting pins 90 to the male connector part of the output wires that are plugged-in to the female connector 92, such that this current is then carried by the wires to respective loads.

With particular regard to the holder base 82, it is seen in FIG. 4 that the holder base 82 includes a box-shaped receptacle 106 that includes an opening 108 on the top side thereof and the female connector 92 on a side thereof. The box-shaped receptacle 106 is formed integrally with a main body 110 of the holder base 82 and is positioned such that it is adjacent input stud 86. The receptacle 106 partially covers the copper bar 86 that is over molded inside the holder base 82 (i.e., inside the main body 110 of the holder base 82). The input and output connecting pins 88, 90 of the fuse holder 80 are positioned within the box-shaped receptacle 106—with the box-shaped receptacle 106 serving as a structure on the holder base 82 to which the PCB fuse assembly 98 can be mounted. In one embodiment, the PCB fuse assembly 98 is attached to the holder base 82 by screwing the PCB 100 to the box-shaped receptacle 106 (e.g., screwed at the four corners of the PCB 100 via screws 80)—with the seal 96 being placed between the PCB 100 and the receptacle 106 to provide ingression protection to the fuses 82 and the PCB 100. Proper mounting of the PCB fuse assembly 98 to the box-shaped receptacle 106 provides for electrical connection between the PCB fuse assembly 98 and the input and output connecting pins 88, 90 of the fuse holder 80.

The holder base 82 is further constructed to include numerous features similar to the holder bases 14, 76 of the fuse holder in FIGS. 1 and 3—and in fact holder base 82 has a footprint identical to those holder bases. Accordingly, holder base 82 includes protrusions 30, mounting holes 32, mating protrusions 42 and mating slots 44 formed therein/thereon identical to those on the holder bases 14, 76 included in the fuse holders 10, 72 of FIGS. 1 and 3—and thus these features are not again described in detail. However, it is reiterated here that the mating protrusions 42 and mating slots 44 formed on each of opposing sides of the holder base 82 are constructed to provide an interlocking fit with like mating protrusions 42 and mating slots 44 of adjacent fuse holders—so as to provide for an interlocked side-by-side arrangement of numerous fuse holders. The holder base 82 further includes a number of latching features 108 formed on the box-shaped receptacle 106 that provide for securing of the cover 94 thereto. In an exemplary embodiment, four latching features 108 are formed on the box-shaped receptacle 106—a pair of features 108 on each of opposing sides of the box-shaped receptacle 106—with the latching features 108 interacting (i.e., snap-fitting) with notches 110 formed in downward extending tabs 112 of the cover 94 in order to secure the cover 94 to the holder base 82.

While the fuse holder 80 of FIG. 4 is shown and described as housing ATM-mini fuses 81 therein, it is recognized that other blade-type fuses could be housed by the fuse holder. That is, according to an embodiment of the invention, the design of the holder base 82 of fuse holder 80 is such that various types of PCB fuse assemblies may be interchanged and electrically/mechanically coupled thereto, such that various blade-type fuses may be held by the fuse holder 80. Accordingly, a common fuse holder 80 may be used for numerous blade-type fuses, including ATM-mini fuses, ATC fuses, and Maxi fuses.

Figure 6:
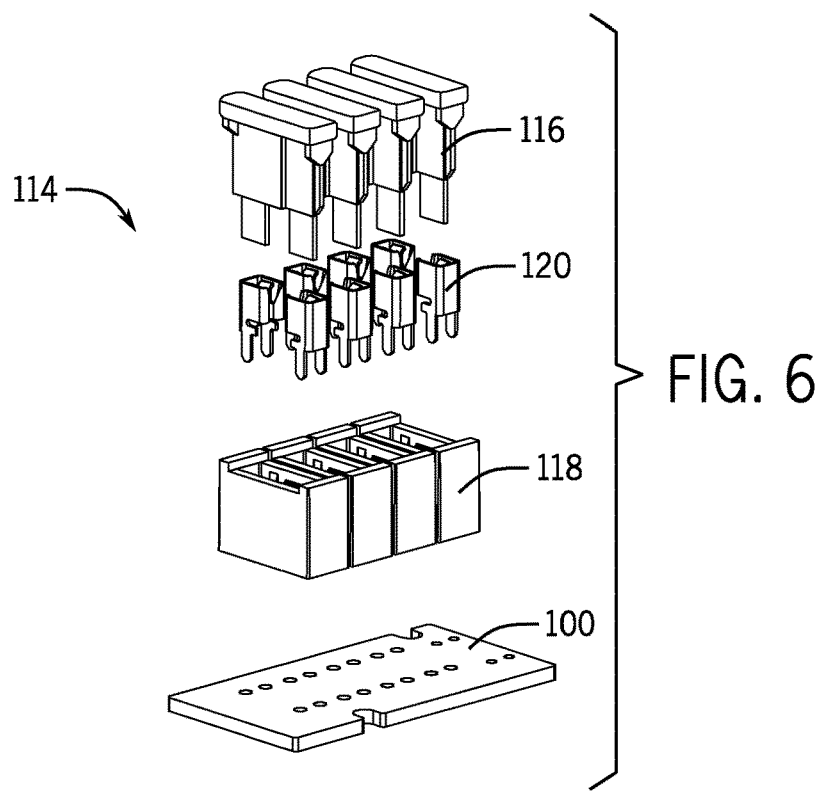
Figure 7:
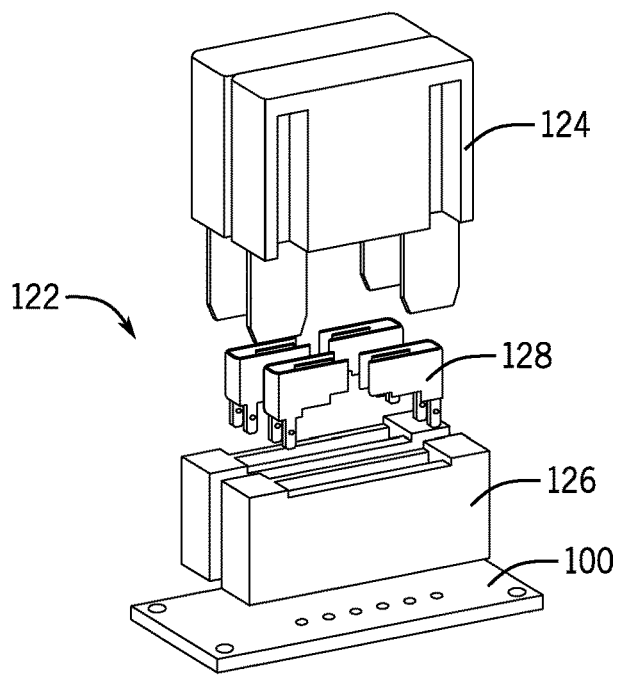

Referring now to FIGS. 6 and 7, embodiments of PCB fuse assemblies that include ATC fuses, and Maxi fuses are shown that may be incorporated with fuse holder. Referring first to FIG. 6, a PCB fuse assembly 114 that includes/houses a number of ATC fuses 116 is shown. The PCB fuse assembly 114 includes a PCB 100, ATC fuses 116, fuse terminal blocks 118, and fuse terminals 120—with these components being similar to the corresponding components of the PCB fuse assembly 98 of FIG. 5 except that the size and shape of the fuse terminal blocks 118 and fuse terminals 120 may vary in order to specifically accommodate the ACT fuses 116. The fuse terminal blocks 118 are secured to the PCB 100 in an arrangement and quantity required to house the desired number of ATC fuses 116 therein. The fuse terminals 120 are positioned within the fuse terminal blocks 118 and soldered to the PCB 100 (to copper trace paths therein) to provide an electrical connection thereto, with the fuse terminals 120 receiving ATC fuses 116 that are inserted therein. The PCB fuse assembly 114 may then be placed onto the holder base 82, such as shown in FIG. 4, in order that the PCB 100 is electrically connected to the input and output connecting pins 88, 90 of the fuse holder 80.

Referring now to FIG. 7, a PCB fuse assembly 122 that includes/houses a pair of Maxi fuses 124 is shown. The PCB fuse assembly 122 includes a PCB 100, Maxi fuses 124, fuse terminal blocks 126, and fuse terminals 128—with these components again being similar to the corresponding components of the PCB fuse assemblies 98, 114 of FIGS. 5 and 6 except that the size and shape of the fuse terminal blocks 126 and fuse terminals 128 may vary in order to specifically accommodate the Maxi fuses 124. The fuse terminal blocks 126 are secured to the PCB 100 in a desired arrangement so as to house the Maxi fuses 124 therein. The fuse terminals 128 are positioned within the fuse terminal blocks 126 and soldered to the PCB 100 (to copper trace paths therein) to provide an electrical connection thereto, with the fuse terminals 128 receiving Maxi fuses 124 that are inserted therein. The PCB fuse assembly 122 may then be placed onto the holder base 82, such as shown in FIG. 4, in order that the PCB 100 is electrically connected to the input and output connecting pins 88, 90 of the fuse holder 80.

Beneficially, the fuse holder 80 thus provides flexibility that enables a customer to use a single fuse holder to house any blade-type fuse, with the various types of fuses being accommodated thereby simply by providing a desired PCB fuse assembly 98, 114, 122 for mounting in/on the fuse holder 80. The fuse holder 80 thus provides ease of operation and maintenance. As an additional benefit, use of the PCB 100 in the PCB fuse assembly 98, 114, 122 allows for the incorporating of additional optional features in the PCB fuse assembly, including smart features such as CAN communication, LED based fuse operation detection, and the like.

Figure 8:
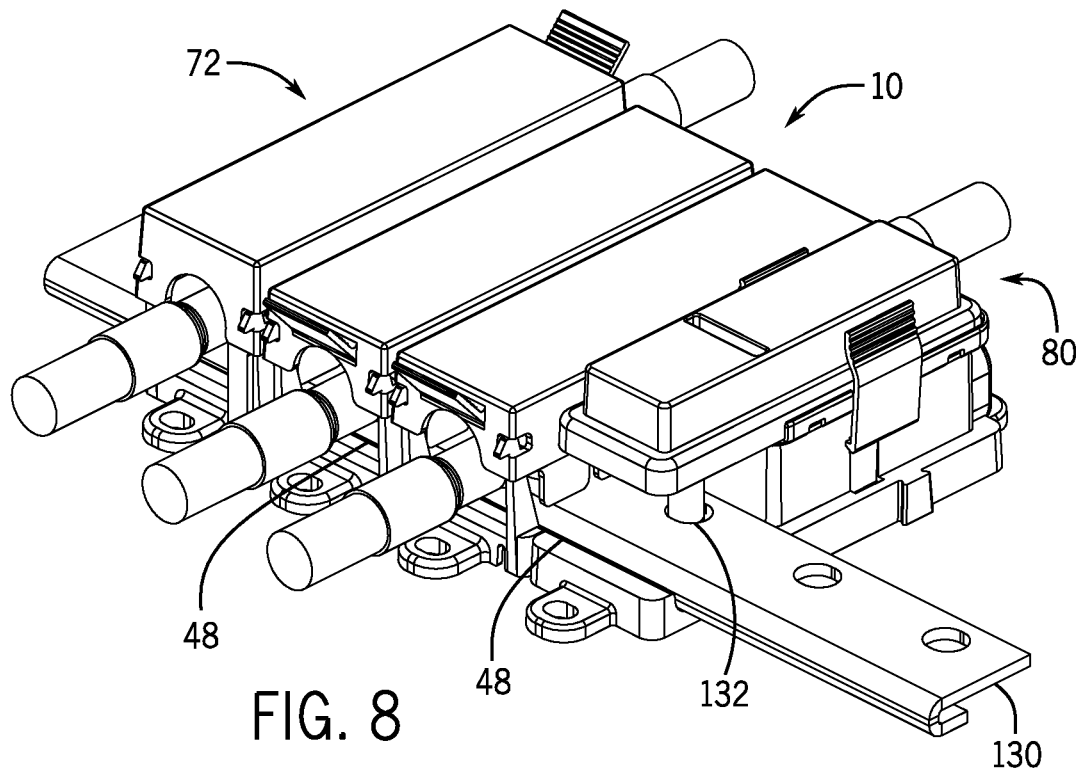
FIGS. 8 and 9 are perspective views of an arrangement of various ones of the fuse holders of FIGS. 1-4 having a common electrical input buss bar according to an embodiment of the invention.
Figure 9:
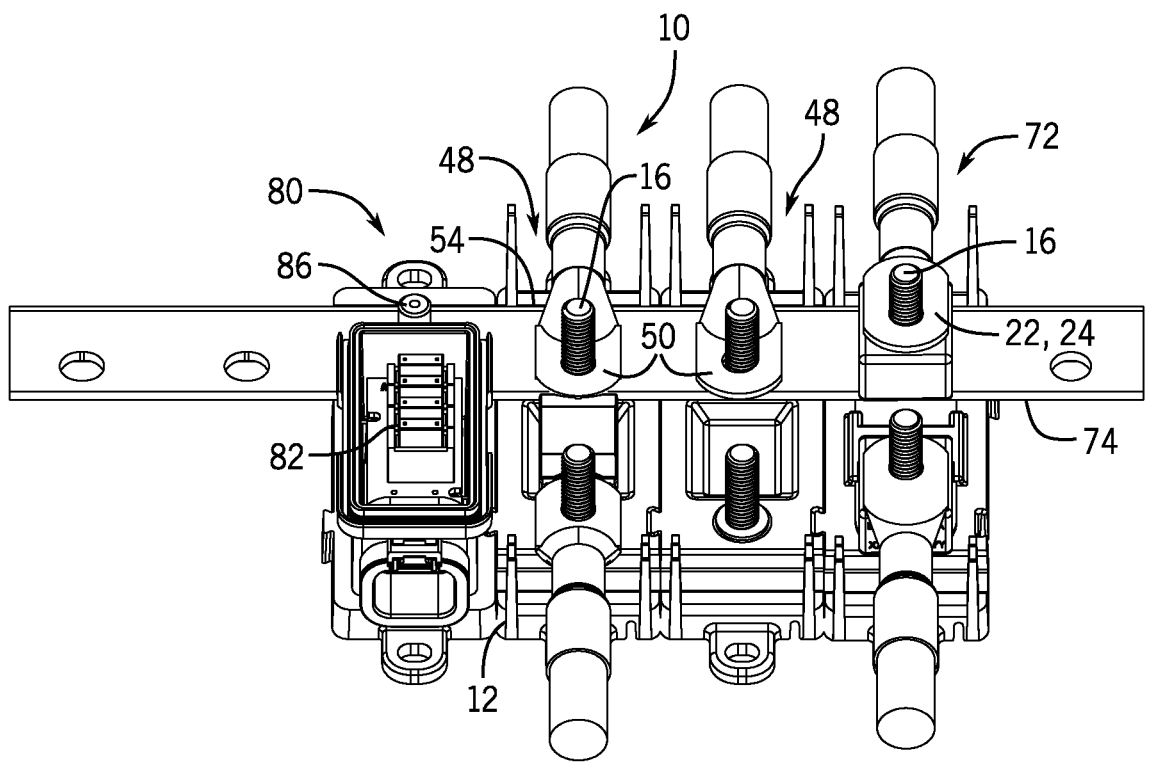

Referring now to FIGS. 8 and 9, various views of an arrangement of modular fuse holders (such as those provided in FIGS. 1-4) are shown according to an embodiment of the invention. In the example provided in FIGS. 8 and 9, the arrangement includes a fuse holder 10 that houses AMG fuses 12, a pair of fuse holders 48 that house AMI fuses 50, a fuse holder 72 that houses Maxi fuses 74 and a fuse holder 80 that houses blade-type AMT-mini fuses 81. As best seen in FIG. 9, the fuse holders 10, 48, 72, 80 are stacked in a side-by-side fashion and joined to adjacent fuse holder(s) via the mating protrusions 42 and mating slots 44 formed on the holder bases 14, 52, 76, 82 thereof. In an exemplary embodiment, the dovetailed protrusions 42 of each holder base provide for a tight interlocking of the fuse holders 10, 48, 72, 80.

As further shown in FIG. 9, the fuse holders 14, 52, 76, 82 are stacked side-by-side such that the input stud 16, 54, 86 of each of the fuse holders is aligned in co-linearity with the input stud of each of the other fuse holders. The co-linearity of the input studs 16, 54, 86 allows for incorporation of a common input buss bar 130 that can provide input power to each of the fuse holders 10, 48, 72, 80 in the arrangement of fuse holders, according to an exemplary embodiment. The input buss bar 130 is formed to include a plurality of holes or openings 132 formed therein that matches the number of fuse holders (i.e., the number of input studs) included in the arrangement. Upon joining and attachment of the fuse holders 10, 48, 72, 80 together, the input buss bar 130 may be aligned with the arrangement of fuse holders such that each hole 132 is positioned above a respective input stud 16, 54, 86. The input buss bar 130 may then be guided down onto the fuse holders 10, 48, 72, 80 via the input studs 16, 54, 86 being slid into and through the holes 132, with the input buss bar then resting and being supported by the fuse holder and/or fuses included therein. The input buss bar 130 is then secured onto the input studs 16, 54, 86 using a hex washer 22 and locknut 24, for example, that is included in each fuse holder 10, 48, 72, 80. Input power may thus be provided to the arrangement of fuse holders 10, 48, 72, 80 by applying input current to the buss bar 130 using an input cable from the battery of the vehicle or machine whose electrical system the fuses are included. This current travels through different fuses in the respective fuse holders and is carried to associated loads through output wires connected on the output side of the fuses in the fuse holders 10, 48, 72, 80.

Beneficially, the construction of the fuse holders 10, 48, 72, 80 shown and described in FIGS. 1-4 provides for differing types of fuses (blade-type, bolt-in, MRBF) to be connected together in an interlocked side-by-side manner, such that an arrangement of fuse holders has a compact footprint and such that both a user and an original equipment manufacturer (OEM) engineer can have all circuit protection devices at one place inside the vehicle so as to improve operational and maintenance efficiency. The arrangement or family of fuse holders may use a common buss bar 130 as the input source, thereby providing efficient operation for the fuses housed in the fuse holder arrangement and reducing wire management problems and electrical issues that might occur during use in harsh environments. Additionally, as the mounting of each of the fuse holders uses similar hardware for bolting the holder base of the fuse holder to a vehicle chassis, the amount of work required by an OEM engineer may be reduced.

An additional benefit provided by the fuse holder 80 is that the fuse holder is able to accommodate numerous types of blade-type fuses therein. A single fuse holder 80 may house any blade-type fuse simply by providing a desired PCB fuse assembly 98, 114, 122 for mounting in/on the common fuse holder 80—with the exact PCB fuse assembly and fuses therein being chosen based on electrical requirements and system operations.

Therefore, according to an embodiment of the invention, a fuse holder includes a holder base comprising a plurality of protrusions each having a mounting hole formed therein to provide for mounting of the holder base to an external component and one or more mating protrusions and one or more mating slots formed on each of opposing side surfaces. The fuse holder also includes an input stud coupled to or formed on the holder base and a cover configured to attach to the holder base to at least partially enclose one or more fuses positionable on the fuse holder. The one or more mating protrusions and the one or more mating slots formed on each of the opposing side surfaces of the holder base comprise dovetailed protrusions and slots of a matching profile capable of receiving such a dovetailed protrusion, so as to enable a side-by-side stacking and interlocking of fuse holders with such mating protrusions and mating slots.

According to another embodiment of the invention, a fuse assembly includes a fuse holder comprising a holder base having a main body, an electrically conductive insert molded in the main body, and a receptacle secured onto or formed integrally with the main body, the receptacle partially covering the electrically conductive insert and extending upwardly from the main body. The fuse holder also includes an input stud coupled to or formed on the holder base and electrically coupled to the electrically conductive insert. The fuse assembly further includes a printed circuit board (PCB) fuse assembly comprising a PCB, fuse terminal blocks mounted to the PCB, fuse terminals positioned within the fuse terminal blocks and electrically connected to the PCB, and blade-type fuses inserted in the fuse terminals and electrically connected to the PCB through the fuse terminals, wherein the PCB fuse assembly is secured onto the receptacle to mount the PCB fuse assembly on the holder base.

According to yet another embodiment of the invention, a fuse holder for holding one or more marine rated battery fuses (MRBF fuses) therein is provided, the fuse holder including a holder base comprising an electrically conductive buss bar molded therein and a pair of connection studs coupled to or formed on the holder base, with the pair of connection studs constructed to provide for positioning of the one or more MRBF fuses thereon. The fuse holder also includes a cover configured to attach to the holder base to cover the one or more MRBF fuses and the pair of connection studs. The electrically conductive buss bar of the holder base transfers power from an input wire or buss bar to the one or more MRBF fuses, with the electrically conductive buss bar being electrically isolated from the pair of connection studs, such that the pair of connection studs are on a load side of the one or more MRBF fuses.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A fuse assembly comprising:
   a fuse holder including:
      a holder base comprising:
         a main body;
         an electrically conductive insert molded in the main body; and
         a receptacle secured onto or formed integrally with the main body, the receptacle partially covering the electrically conductive insert and extending upwardly from the main body; and
an input stud coupled to or formed on the holder base and electrically coupled to the electrically conductive insert; and
a printed circuit board (PCB) fuse assembly including:
a printed circuit board (PCB);
fuse terminal blocks mounted to the PCB;
fuse terminals positioned within the fuse terminal blocks and electrically connected to the PCB; and
blade-type fuses inserted in the fuse terminals and electrically connected to the PCB through the fuse terminals;
wherein the PCB fuse assembly is secured onto the receptacle to mount the PCB fuse assembly on the holder base.

2. The fuse assembly of claim 1 wherein the fuse holder further comprises input and output connecting pins positioned within the receptacle for providing input power to the PCB fuse assembly and transferring output power from the PCB fuse assembly.

3. The fuse assembly of claim 2 wherein the receptacle includes a female output connector formed on surface thereof to which the output power is provided.

4. The fuse assembly of claim 3 wherein the input connecting pins electrically and mechanically couple the PCB fuse assembly to the electrically conductive insert and the output connecting pins mechanically and electrically couple the PCB fuse assembly to the female output connector.

5. The fuse assembly of claim 1 wherein the blade-type fuses comprise one of ATM-mini fuses, ATC fuses, and Maxi fuses.

6. The fuse assembly of claim 1 wherein the main body of the holder base includes a plurality of mating protrusions and a plurality of mating slots formed on side surfaces thereof, with the plurality of mating protrusions and mating slots comprising dovetailed protrusions and slots of a matching profile capable of receiving such a dovetailed protrusion, so as to enable a side-by-side stacking and interlocking of fuse holders with such mating protrusions and mating slots.

7. The fuse holder of claim 1 further comprising an input buss bar bolted to the input stud to provide power to the fuse assembly.

8. The fuse holder of claim 1 further comprising a seal positioned between the PCB and the receptacle to provide ingression protection to the blade-type fuses and the PCB.

9. The fuse holder of claim 1 wherein the electrically conductive insert is bent at 90° such that first and second portions thereof are orthogonal to one another.

10. The fuse holder of claim 1 further comprising a cover configured to at least partially enclose the PCB fuse assembly, wherein the receptacle comprises a pair of latching features on each of opposing sides thereof configured to mate with notches formed in downward extending tabs of the cover to secure the cover to the holder base.

11. A fuse holder configured to house a plurality of blade type fuses therein, the fuse holder comprising:
a holder base including:
a main body;
a box-shaped receptacle formed integrally with the main body and configured to receive a printed circuit board (PCB) fuse assembly therein, the PCB fuse assembly including a PCB and fuse terminal blocks mounted to the PCB to accept the plurality of blade type fuses; and
an electrically conductive insert molded in the main body;
wherein the PCB fuse assembly is securable onto the box-shaped receptacle to mount the PCB fuse assembly on the holder base; and
an input stud coupled to or formed on the holder base and electrically coupled to the electrically conductive insert.

12. The fuse holder of claim 11 wherein the holder base comprises:
a plurality of protrusions each having a mounting hole formed therein to provide for mounting of the holder base to an external component; and
one or more mating protrusions and one or more mating slots formed on each of opposing side surfaces;
wherein the one or more mating protrusions and the one or more mating slots formed on each of the opposing side surfaces of the holder base comprise dovetailed protrusions and slots of a matching profile capable of receiving such a dovetailed protrusion, so as to enable a side-by-side stacking and interlocking of fuse holders with such mating protrusions and mating slots.

13. The fuse holder of claim 11 further comprising a cover configured to attach to the box-shaped receptacle to at least partially enclose the PCB fuse assembly.

14. The fuse holder of claim 11 further comprising an input buss bar bolted to the input stud to provide power to the fuse holder.

15. The fuse holder of claim 11 further comprising input and output connecting pins positioned within the box-shaped receptacle for providing input power to the PCB fuse assembly and transferring output power from the PCB fuse assembly.

16. The fuse holder of claim 15 wherein the receptacle includes a female output connector formed on surface thereof to which the output power is provided.

17. The fuse holder of claim 16 wherein the input connecting pins electrically and mechanically couple the PCB fuse assembly to the electrically conductive insert and the output connecting pins mechanically and electrically couple the PCB fuse assembly to the female output connector.

18. The fuse holder of claim 11 wherein the electrically conductive insert is bent at 90° such that first and second portions thereof are orthogonal to one another.

* * * * *